United States Patent
Huang

(10) Patent No.: US 10,204,793 B2
(45) Date of Patent: Feb. 12, 2019

(54) CHEMICAL MECHANICAL POLISHING SLURRY, METHOD FOR CHEMICAL MECHANICAL POLISHING AND MANUFACTURING METHOD OF SEMICONDUCTOR STRUCTURE

(71) Applicant: TAIWAN SEMICONDUCTOR MANUFACTURING COMPANY LTD., Hsinchu (TW)

(72) Inventor: Shu-Hao Huang, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/156,867

(22) Filed: May 17, 2016

(65) Prior Publication Data
US 2017/0338123 A1   Nov. 23, 2017

(51) Int. Cl.
*H01L 21/306* (2006.01)
*C09G 1/04* (2006.01)
*C09G 1/02* (2006.01)

(52) U.S. Cl.
CPC .......... *H01L 21/30625* (2013.01); *C09G 1/02* (2013.01); *C09G 1/04* (2013.01)

(58) Field of Classification Search
CPC ............. H01L 21/3212–21/32125; H01L 2224/03616; H01L 2224/03845; H01L 2224/11616; H01L 2224/27616; H01L 2224/27845
See application file for complete search history.

(56) References Cited

U.S. PATENT DOCUMENTS

| | | | | |
|---|---|---|---|---|
| 6,300,246 B1 * | 10/2001 | Huynh | ................. | B24B 37/042 257/E21.228 |
| 6,399,502 B1 * | 6/2002 | Hernandez | ............ | B82Y 10/00 216/38 |
| 8,080,826 B1 * | 12/2011 | Johnson | .............. | H01L 21/2007 257/77 |
| 8,232,582 B2 * | 7/2012 | Sauer | ................... | C12Q 1/6874 205/778 |
| 9,559,014 B1 * | 1/2017 | Basker | ............ | H01L 21/823821 |
| 2011/0039475 A1 * | 2/2011 | Hoshi | ................... | B24B 37/044 451/28 |

(Continued)

*Primary Examiner* — Julia Slutsker
(74) *Attorney, Agent, or Firm* — WPAT, P.C., Intellectual Property Attorneys; Anthony King

(57) ABSTRACT

A chemical mechanical polishing (CMP) slurry, a method for CMP, and a manufacturing method of a semiconductor structure are provided. The CMP slurry includes a pH-adjustor for providing an alkaline environment in the CMP slurry and a silicon inhibitor for lowering a removal rate of silicon. The CMP slurry is used in a planarization operation to remove portions of a semiconductor region and portions of a silicon region. The semiconductor region comprises at least one semiconductor material different from silicon. The semiconductor region is formed in a recess adjacent to the silicon region. The particle defect condition may be improved by applying the alkaline CMP slurry, and the silicon inhibitor may be used to modify the removal rate selectivity between the semiconductor region and the silicon region in the planarization operation.

20 Claims, 12 Drawing Sheets

(56) References Cited

U.S. PATENT DOCUMENTS

| | | | |
|---|---|---|---|
| 2012/0129346 A1* | 5/2012 | Ryuzaki | B24B 37/044 438/693 |
| 2015/0279696 A1* | 10/2015 | Cohen | H01L 21/3247 257/76 |
| 2017/0045475 A1* | 2/2017 | Astier | B01L 3/502707 |
| 2017/0162432 A1* | 6/2017 | Nien | H01L 21/76229 |

* cited by examiner

CHEMICAL MECHANICAL POLISHING SLURRY, METHOD FOR CHEMICAL MECHANICAL POLISHING AND MANUFACTURING METHOD OF SEMICONDUCTOR STRUCTURE

BACKGROUND

The operation speed of Metal-Oxide-Semiconductor (MOS) transistors is substantially related to the drive currents of the MOS transistors, and the drive currents are further related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as compound semiconductors hereinafter) are good candidates for forming transistors due to their high electron mobility. Therefore, III-V based transistors have been explored. III-V compound semiconductor films, however, need to be grown on other substrates because it is difficult to obtain bulk III-V crystals. The formation of III-V compound semiconductors typically includes an epitaxy growth, followed by a chemical mechanical polishing (CMP) to remove excess III-V compound semiconductors. CMP is commonly used in the semiconductor manufacturing industry to polish and remove materials from a surface of a semiconductor substrate. The performances of the CMP, such as the removal rate and the selectivity, are closely related to the content of the slurry applied in the CMP.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
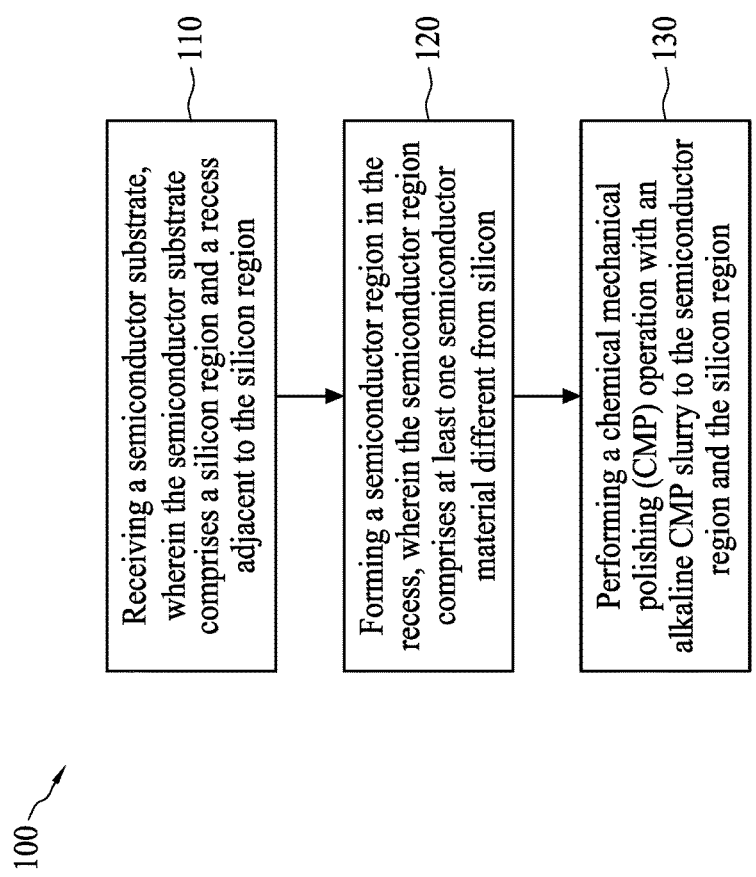
FIG. 1 is a flow diagram illustrating a manufacturing method of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "silicon inhibitor" includes an inhibitor configured to control the removal rate selectivity of a chemical mechanical polishing (CMP) operation and/or lower a removal rate of silicon in the CMP operation. The silicon inhibitor may be used to achieve these purposes by inhibiting oxidation of silicon or other suitable mechanisms.

As the integrated circuit (IC) fabrication moves to advanced technology nodes, the IC feature size scales down to smaller dimensions. Relatively, the control limitation for the particle defect level about the particle size and the particle amount becomes stricter in the advanced technology nodes. Chemical mechanical polishing (CMP) is commonly used in the semiconductor manufacturing industry to polish and remove materials from a surface of a semiconductor substrate. However, abrasive particles used in the CMP process may result in serious particle defect issues, more cleaning processes and/or cleaning time may be required to remove the particles, and the manufacturing capability may be affected accordingly.

In the present disclosure, a chemical mechanical polishing (CMP) slurry for polishing a semiconductor region and a silicon region at the same time is provided, and the semiconductor region comprises at least one semiconductor material different from silicon. The CMP slurry includes a pH-adjustor for providing an alkaline environment in the CMP slurry and a silicon inhibitor for lowering a removal rate of the silicon region. In other words, the CMP slurry is an alkaline CMP slurry. The alkaline environment in the CMP slurry formed by the pH-adjustor is beneficial to reduce particles remaining on a semiconductor substrate after the CMP operation and related cleaning processes. The silicon inhibitor reduces the removal rate of the silicon region in the planarization operation, and the removal rate selectivity between the semiconductor region and the silicon region may be modified accordingly. In some embodiment, the semiconductor region is a channel region for a metal-oxide-semiconductor (MOS) field effect transistor (FET), but the present disclosure is not limited to this. The CMP slurry applied for polishing the silicon region and the semiconductor region configured to be other parts of a semiconductor device is still within the contemplated scope of the present disclosure.

FIG. 1 is a flow diagram illustrating a manufacturing method of a semiconductor structure in accordance with some embodiments of the present disclosure. The manufacturing method 100 begins with operation 110, in which a semiconductor substrate comprising a silicon region and a recess adjacent to the silicon region is received. The manufacturing method 100 proceeds with operation 120, in which a semiconductor region is formed in the recess, and the semiconductor region comprises at least one semiconductor material different from silicon. The manufacturing method 100 continues with operation 130 in which, a chemical mechanical polishing (CMP) operation with an alkaline CMP slurry is performed to the semiconductor region and the silicon region.

The manufacturing method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
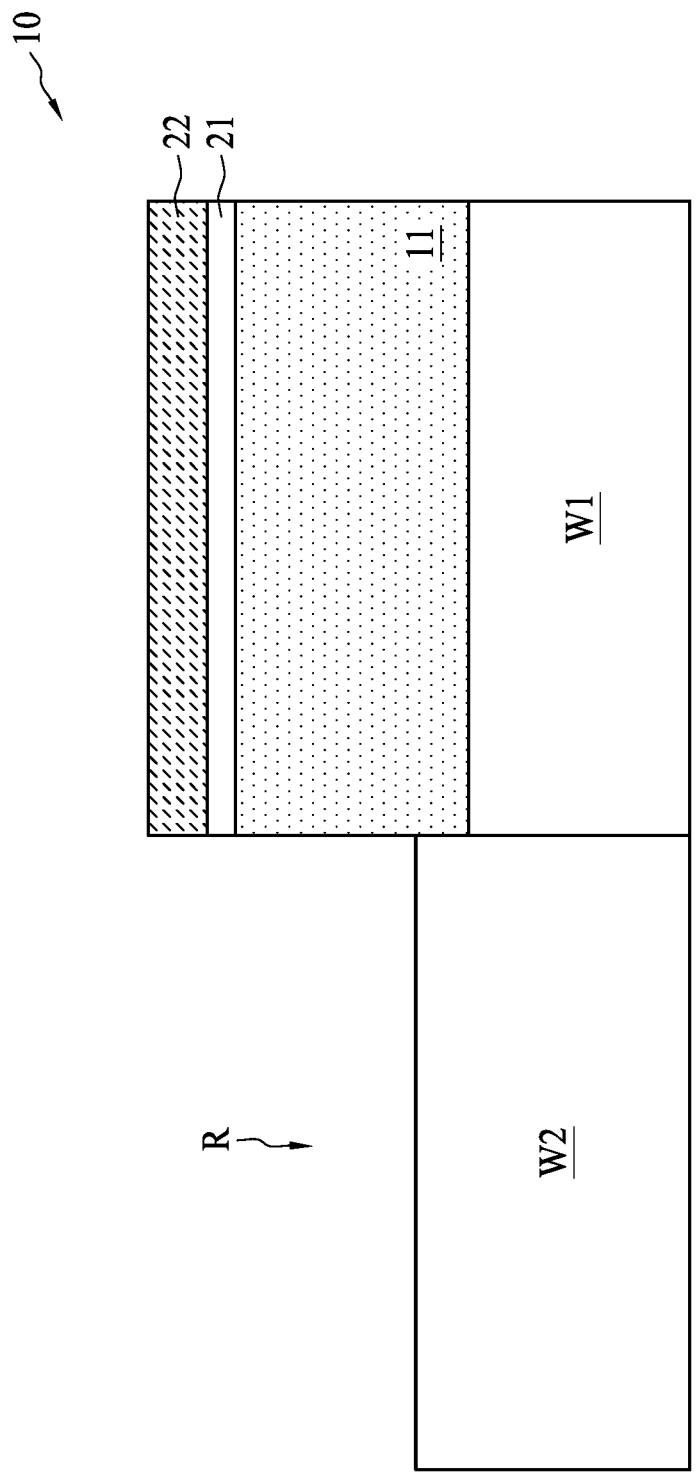
FIGS. 2A, 2B, 2C, 2D, and 2E are cross-sectional views at one of various operations of a manufacturing method of a semiconductor structure in accordance with some embodiments of the present disclosure.

FIGS. 2A, 2B, 2G, 2D, and 2E are cross-sectional views at one of various operations of a manufacturing method of a semiconductor structure in accordance with some embodiments of the present disclosure. FIG. 2C is a schematic diagram illustrating a first chemical mechanical polishing (CMP) operation in the manufacturing method, and FIG. 2I) is a schematic diagram illustrating a second CMP operation in the manufacturing method. As depicted in FIG. 2A and operation 110 in FIG. 1, the manufacturing method 100 begins with operation 110, in which a semiconductor substrate 10 including a silicon region 11 and a recess R adjacent to the silicon region 11 is received. In some embodiments, the semiconductor substrate 10 includes a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the semiconductor substrate 10 includes a multilayered substrate, such as a silicon-on-insulator (SOI) substrate, which includes a bottom semiconductor layer, a buried oxide layer (BOX) and a top semiconductor layer. In still some embodiments, the semiconductor substrate 10 includes an insulation substrate, such as a glass substrate, a conductive substrate, or any other suitable substrates. In some embodiments, a first well W1 and a second well W2 are formed in the semiconductor substrate 10, and the first well W1 may be formed under the silicon region 11. The first well W1 and the second well W2 may be formed by implantation processes respectively, but not limited thereto. The silicon region 11 includes a pure silicon region such as a polycrystalline silicon region, a single crystalline silicon, or an amorphous silicon region. The first well W1 may be a first conductivity type doped well, the second well W2 may be a second conductivity type doped well, and the first conductivity type is opposite to the second conductivity type. For example, the first well W1 is a P-well and the second well W2 is an N-well in some embodiments. However, other kinds of conductivity type combinations for the first well W1 and the second well W2 or semiconductor substrates without forming the first well W1 and/or the second well W2 are still within the contemplated scope of the present disclosure.

In some embodiments, a first mask layer 21 may be formed on the silicon region 11. The first mask layer 21 may include dielectric material such as silicon dioxide, silicon nitride, silicon oxynitride, undoped silicon glass (USG) or any other suitable dielectric materials. The first mask layer 21 may be formed by atomic layer deposition (ALD), chemical vapor deposition (CVD) or any other suitable operations. The first mask layer 21 may be patterned by suitable operations such as a photolithographic process, and the first mask layer 21 is used as a mask for forming a recess R adjacent to the silicon region 11. The recess R may be formed by an etching process or other appropriate operations. In some embodiments, another hard mask layer such as a second mask layer 22 may be formed on the first mask layer 21 for further protecting the silicon region 11 during the etching process of forming the recess R, and the second mask layer 22 may be removed after the operation of forming the recess R optionally, but not limited thereto. The second mask layer 22 may include dielectric material such as silicon dioxide, silicon nitride, silicon oxynitride, USG or any other suitable dielectric materials. In some embodiment, the material of the second mask layer 22 is different from that of the first mask layer 21. For example, the second mask layer 22 may be a silicon nitride layer while the first mask layer 21 is a silicon oxide layer. The first mask layer 21 may have a relatively thinner thickness for reducing the process time of the subsequent operation of removing the first mask layer 21.

Figure 2B:
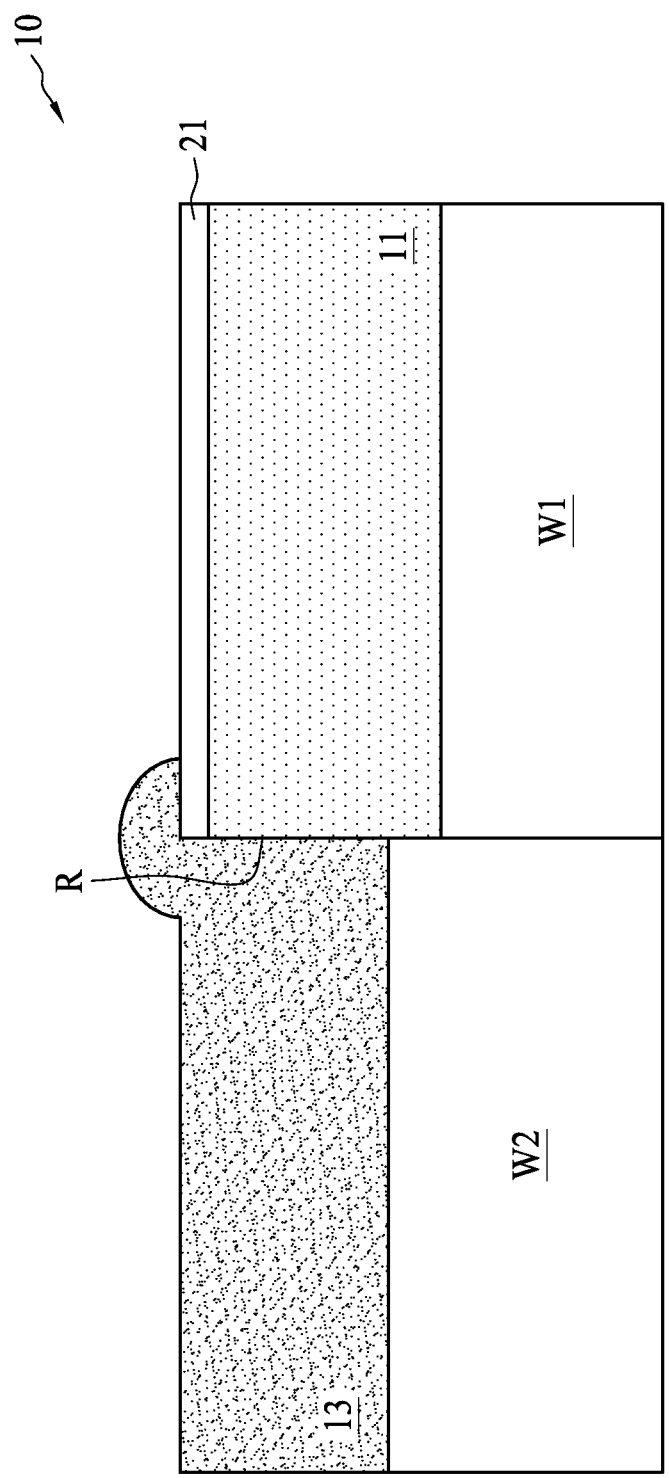
Figure 2C:
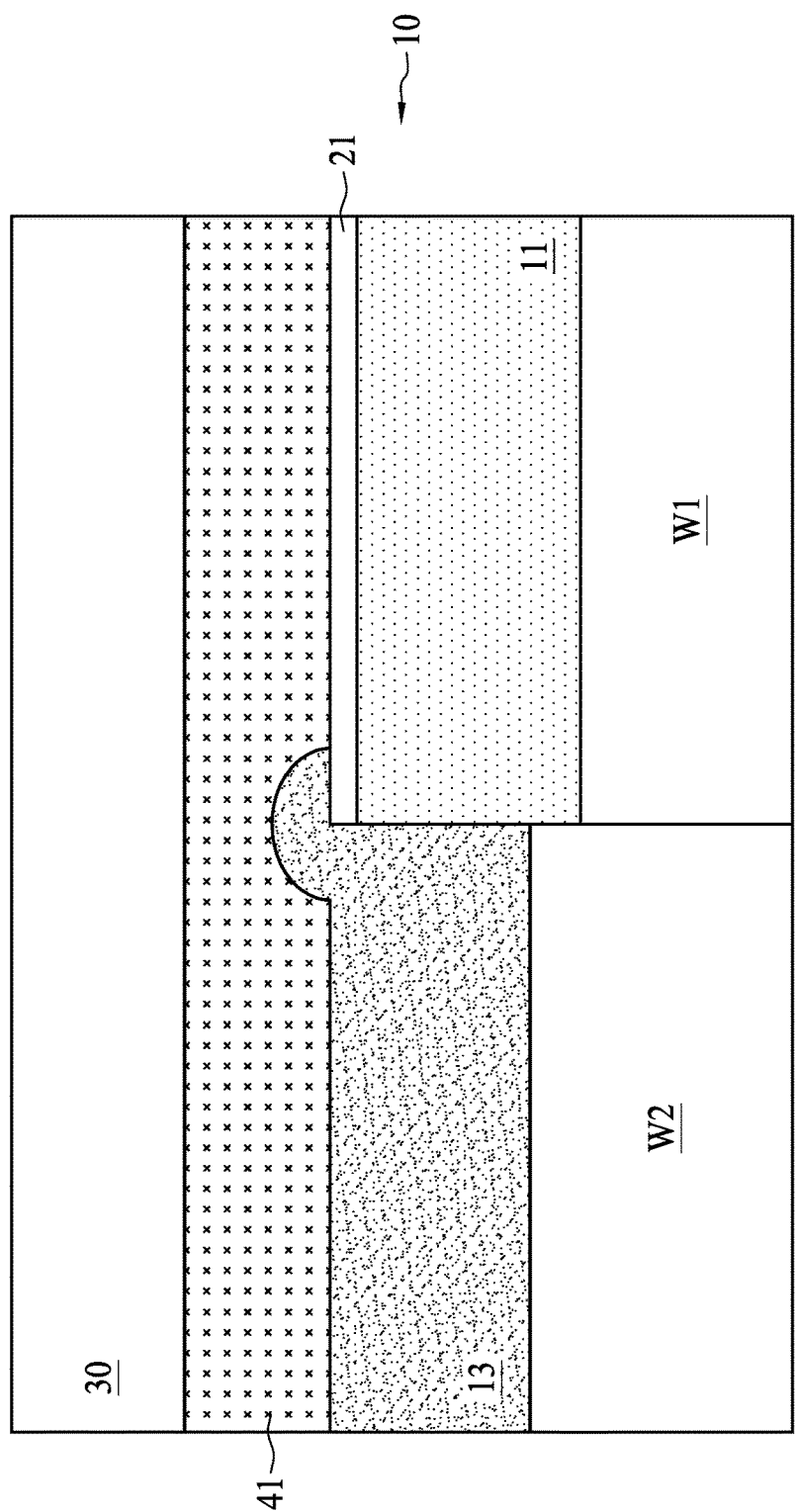

As depicted in FIG. 2B and operation 120 in FIG. 1, a semiconductor region 13 is formed in the recess R. The semiconductor region 13 includes at least one semiconductor material different from silicon, and the semiconductor region 13 may be formed by an epitaxial growth process or other suitable operations. In other words, the semiconductor region 13 may be an epitaxial region, but not limited thereto. In some embodiments, the semiconductor region 13 may include a silicon germanium (SiGe) region, with the atomic percentage of germanium greater than zero percent, and equal to or smaller than 100 percent. When the atomic percentage of germanium is 100 percent, the semiconductor region 13 is formed of pure germanium. In some alternative embodiments, the semiconductor region 13 comprises a III-V compound semiconductor material selected from: InAs, AlAs, GaAs, InP, GaN, InGaAs, InAlAs, GaSb, AlSb, AlP, GaP, or combinations thereof. The semiconductor region 13 may be a homogenous region, with the bottom portions and top portions formed of a same material. The semiconductor region 13 may also be a composite region, with bottom portions and top portions comprising different materials or having different compositions. For example, the upper portions of the semiconductor region 13 may have greater lattice mismatch than lower portions. In some embodiments, the semiconductor region 13 includes silicon germanium, with the upper portions having greater germanium percentages than lower portions.

In some embodiments, the semiconductor region 13 is formed by a selective epitaxial growth (SEG) operation, and the semiconductor region 13 such as the silicon germanium region may be selectively formed on the semiconductor substrate 10 exposed by the recess R with the first mask layer 21 as a mask in the SEG operation, but the present disclosure is not limited to this. The semiconductor region 13 formed by other suitable operations is within the contemplated scope of the present disclosure. In some embodiments, the semiconductor region 13 may grow a little bit excessively and partially cover the first mask layer 21 on the silicon region 11, but not limited thereto. The semiconductor region 13 is formed in the recess adjacent to the silicon region 11. In other words, the semiconductor substrate 10 includes the silicon region 11 and the semiconductor region 13 adjacent to the silicon region 11 before subsequent planarization processes.

As depicted in FIG. 2C, a first chemical mechanical polishing (CMP) operation with a first slurry 41 is performed to remove the first mask layer 21 and portions of the semiconductor region 13. The CMP slurry is chemically reactive toward materials being polished and may include abrasives and required chemical components. For example, in some embodiments, the first slurry 41 may include abrasive particles, surfactants, oxidizers, enhancers, suspending agents, or other suitable materials that are used in polishing slurries. A CMP apparatus including a polishing pad 30 is used to perform the CMP operation. The CMP apparatus further includes a stage (not shown) for receiving the semiconductor substrate 10. The CMP apparatus includes means for providing force which urges the polishing pad 30 and the stage toward one another. The first slurry 41 is introduced between polishing pad 30 and the semiconductor substrate 10. The polishing pad 30 may be formed of polyurethane or other suitable material.

In some embodiments, the first slurry 41 may have a first selectivity, with the first selectivity being a ratio of a removal rate of the first mask layer 21 to a removal rate of the semiconductor region 13. In some embodiments, the first selectivity of the first slurry 41 is equal to or higher than 1, and the first selectivity may be equal to or higher than 3 in other exemplary embodiments for further removing the first mask layer 21 more efficiently and completely in the first CMP operation. In addition, the first slurry 41 may have a second selectivity, with the second selectivity being a ratio of the removal rate of the first mask layer 21 to a removal rate of the silicon region 11, and the second selectivity of the first slurry 41 is higher than 4 for reducing the loss of the silicon region 11 in the first CMP operation with the first slurry 41. For example, the removal rate of the first mask layer 21 in the first slurry 41 may be about 200 angstroms; min, but not limited thereto. In some embodiments, the first slurry 41 is an acidic slurry for proving the required selectivity, but not limited thereto.

Figure 2D:
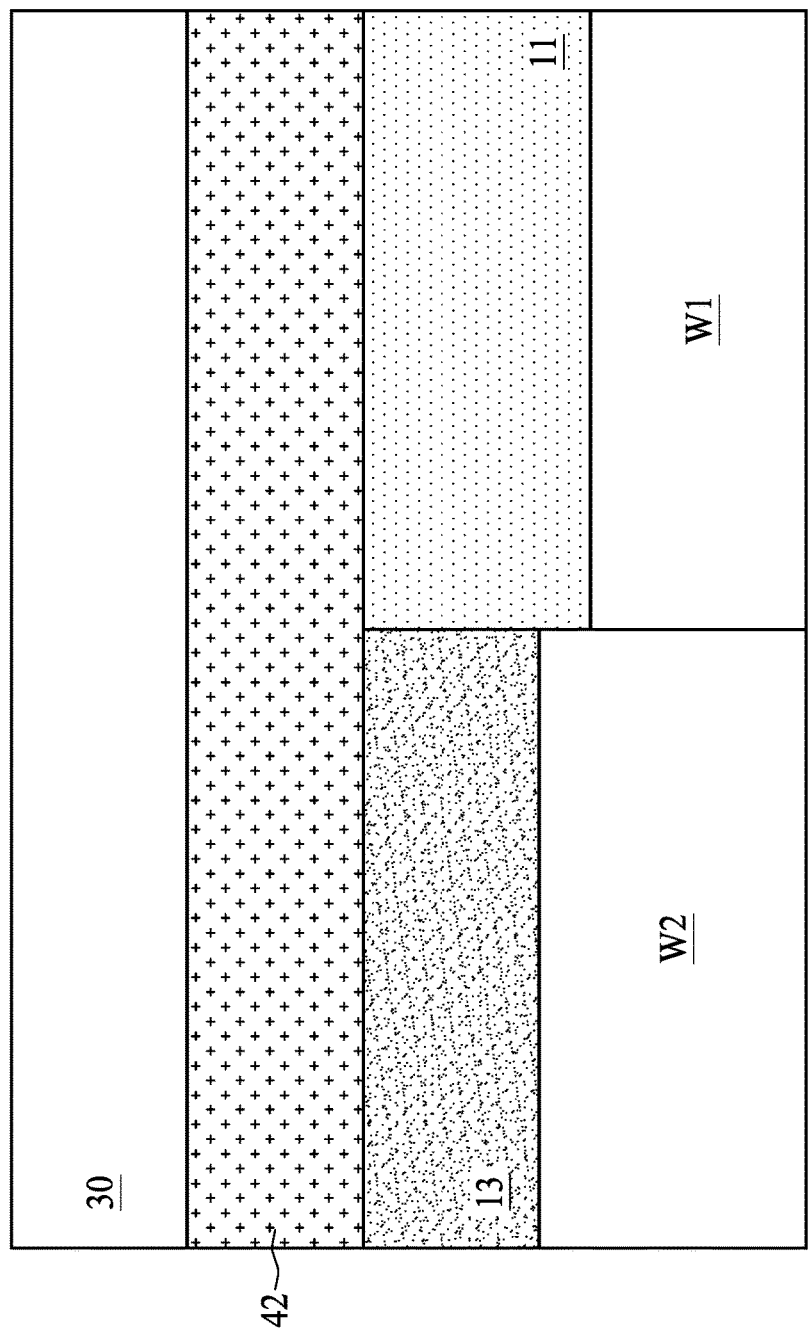

As depicted in FIG. 2D and operation 130 in FIG. 1, a second CMP operation with a second slurry 42 is performed to the semiconductor region 13 and the silicon region 11. In some embodiments, the second slurry 42 is an alkaline CMP slurry which is different from the first slurry in the first CMP operation described in FIG. 2C, but not limited thereto. In some embodiments, a cleaning operation may be performed between the first CMP operation and the second CMP operation optionally, and one or more cleaning operations may be performed after the second CMP operation for reducing particles remaining on the semiconductor substrate. In another exemplary embodiment, the first CMP operation and the second CMP operation may be performed continuously without any cleaning operations performed between the first CMP operation and the second CMP operation. In yet another exemplary embodiment, the first CMP operation and the second CMP operation may be performed with the same slurry such as the second slurry 42.

In some embodiments, the second slurry 42 includes a pH-adjustor and a silicon inhibitor. The pH-adjustor is configured to provide an alkaline environment in the second slurry 42. The pH adjustor includes at least one of ammonium hydroxide ($NH_4OH$), a quaternary ammonium hydroxide salt, a combination thereof, or other suitable alkaline sources. For example, the quaternary ammonium hydroxide salt may include tetramethylammonium hydroxide (TMAH), tetraethylammonium hydroxide (YEAH), or choline hydroxide. Additionally, in some embodiments, the second slurry 42 may further include abrasive particles, surfactants, oxidizers, enhancers, suspending agents, or other suitable materials that are used in polishing slurries. The abrasives particles may be formed of silica (silicon dioxide), including fumed silica or colloidal silica or other suitable materials. In some embodiments, the alkaline environment in the CMP slurry is used to improve the particle defect condition after the planarization operation and the post cleaning operation because the zeta potential of the abrasive particles, such as colloidal silica particles, becomes higher in the alkaline environment with higher pH value.

Zeta potential is a scientific term for electrokinetic potential in colloidal dispersions. The zeta potential is the electric potential in the interfacial double layer at the location of the slipping plane relative to a point in the bulk fluid away from the interface. In other words, zeta potential is the potential difference between the dispersion medium and the stationary layer of fluid attached to the dispersed particle. The magnitude of the zeta potential indicates the degree of electrostatic repulsion between adjacent, similarly charged particles in a dispersion medium. For small particles, a high zeta potential will confer stability, i.e., the solution or dispersion will resist aggregation. When the zeta potential is small, attractive forces may exceed this repulsion and the dispersion may break and flocculate. In other words, the repulsive force between the particles and other materials such as the semiconductor substrate will also increase in the alkaline CMP slurry, and the particle defect condition may be improving by introducing the alkaline CMP slurry. Accordingly, in some embodiments, the second slurry 42 has a pH value higher than 7 and lower than or equal to 12 for keeping an alkaline environment during the second CMP operation. In other exemplary embodiments, the second slurry 42 has a pH value between 8 and 10 for ensuring the purpose of reducing particle defects and preventing other possible damages by the strong alkaline condition. By using the alkaline CMP slurry in the second CMP operation, the capability of the cleaning operation after the second CMP operation may also be enhanced.

In some embodiments, the silicon inhibitor in the second slurry 42 is configured to lower a removal rate of silicon in a CMP operation with the second slurry 42. In other words, the silicon inhibitor may be used to lower a removal rate of the silicon region 11 in the second CMP operation with the second slurry 42. In some embodiments, the silicon inhibitor may include alkyl carboxylic acid, poly ethylene glycol, polyoxyethylene alkyl ether, or other suitable materials capable of lowering the removal rate of silicon in the alkaline CMP slurry. The polyoxyethylene alkyl ether mentioned above may include polyoxyethylene lauryl ether, polyoxyethylene tridecyl ether, or other kinds of polyoxyethylene alkyl ether. The polyoxyethylene alkyl ether is a relatively stronger silicon inhibitor because the polyoxyethylene alkyl ether has both a hydrophobic end and a hydrophilic end for lowering the removal rate of silicon in the alkaline condition.

In some embodiments, a concentration of the silicon inhibitor in the second slurry 42 is lower than or equal to 0.1% by weight for keeping the required removal rate in the second slurry 42. In some embodiments, the second slurry 42 has a selectivity, with the selectivity being a ratio of a first removal rate of the semiconductor region 13 to a second removal rate of the silicon region 11, and the selectivity is higher than 0.6. In other exemplary embodiments, the selectivity of the second slurry 42 may range between 1 and 2 for removing relatively more amount of the semiconductor region. In yet another exemplary embodiment, the selectivity of the second slurry 42 may range between 1 and 4 for compensating the removal selectivity in the first CMP operation. For example, when the removal rate of the first mask layer is higher than that of the semiconductor region 13 in the first CMP operation, the top surface of the semiconductor region 13 may be higher than that of the silicon region 11 after the first CMP operation and before the second CMP operation, and the removal rate of the semiconductor region 13 in the second CMP operation has to be higher than that of the silicon region 11 in the second CMP operation. The selectivity and the removal rate of the second slurry 42 may be modified and controlled by adjusting the amount and/or the content of the silicon inhibitor in the second slurry 42. In other words, the silicon inhibitor may be used to control the removal rate and the selectivity of the CMP operation because the removal rate of the silicon region 11 is lowered by the silicon inhibitor, and the influence of the silicon inhibitor on the removal rate of the semiconductor region 13 including at least one semiconductor material different from silicon will be less in respect to the influence of the silicon inhibitor on the silicon region 11. For example, in some embodiments, the first removal rate of the semiconductor region 13 in the second slurry 42 may be less than 1000 angstroms/min for increasing the process margin of the second CMP process by using the silicon inhibitor. In other exemplary embodiments, the first removal rate of the semiconductor region 13 may be about 150 angstroms/min, but not limited thereto. By using an alkaline CMP slurry without a silicon inhibitor, the removal rate of the silicon region will be higher than 2000 angstroms/min, and it is difficult to complete the planarization operation within a relatively shorter CMP operation time based on the thickness of the silicon region and the thickness of the semiconductor region.

Figure 2E:
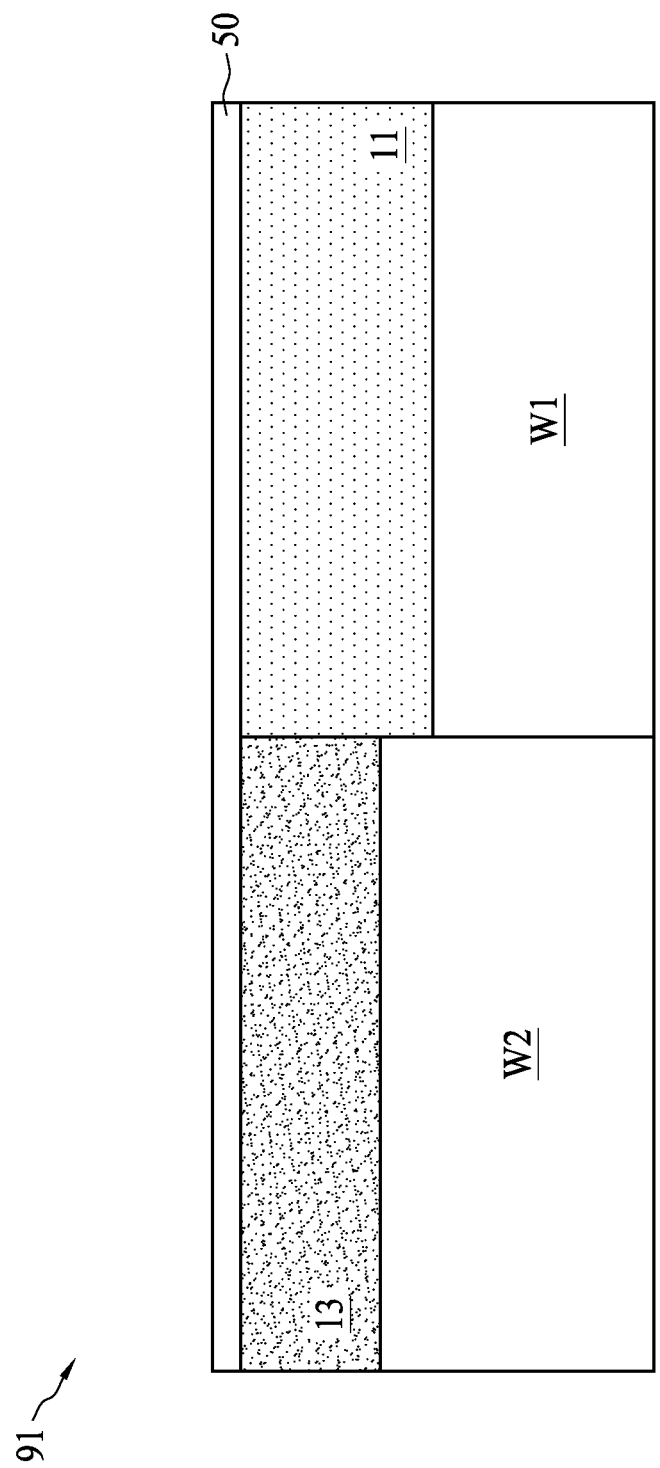

As depicted in FIG. 2E, after the second CMP operation and the post cleaning operation, a cap layer 50 may be formed on the semiconductor region 13 and the silicon region 11 for forming a semiconductor structure 91. The cap layer 50 may include a silicon cap layer or other suitable materials. In some embodiments, the semiconductor region 13 and the silicon region 11 in the semiconductor structure 91 may be channel regions for different conductive type metal-oxide-semiconductor (MOS) field effect transistors (FETs). For example, the semiconductor region 13 may be a channel region of a PMOSFET, and the silicon region 11 may be a channel region of a NMOSFET, but the present disclosure is not limited to this. The silicon region 11 and the semiconductor region 13 configured to be other parts of a semiconductor device, such as the channel region and the source/drain region of the same MOSFET are within the contemplated scope of the present disclosure.

The present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
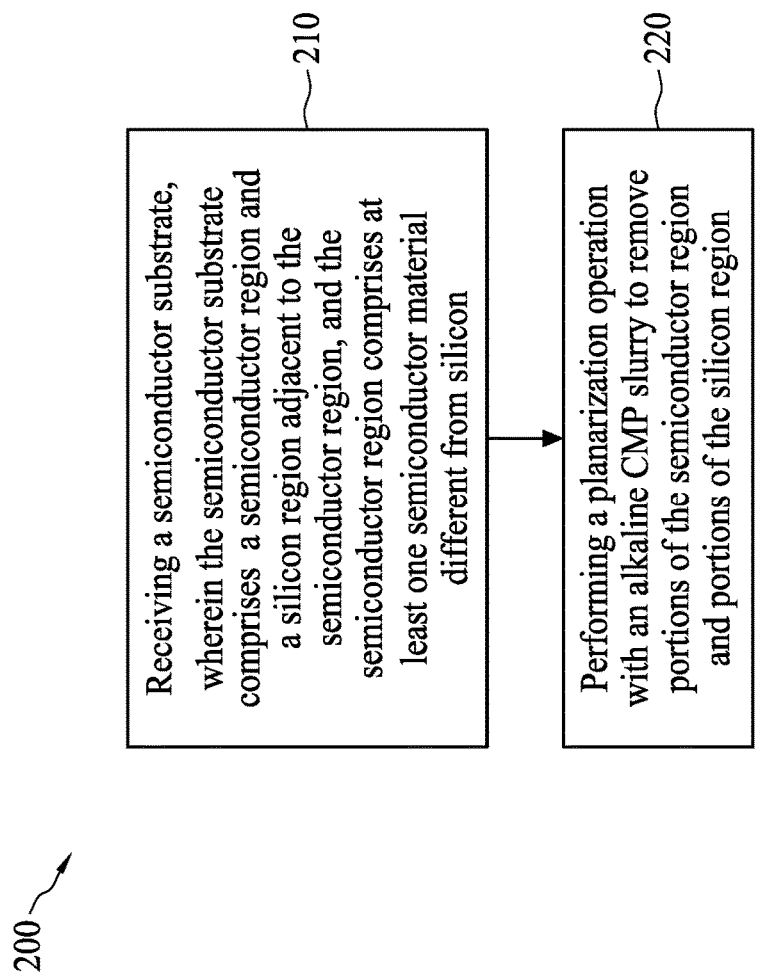
FIG. 3 is a flow diagram illustrating a method for chemical mechanical polishing in accordance with some embodiments of the present disclosure.

FIG. 3 is a flow diagram illustrating a method for chemical mechanical polishing in accordance with some embodiments of the present disclosure. The method 200 begins with operation 210, in which a semiconductor substrate comprising a semiconductor region and a silicon region adjacent to the semiconductor region is received, and the semiconductor region comprises at least one semiconductor material different from silicon. The manufacturing method 200 proceeds with operation 220, in which a planarization operation with an alkaline CMP slurry is performed to remove portions of the semiconductor region and portions of the silicon region.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

As depicted in FIG. 2D and operation 210 in FIG. 3, the semiconductor substrate 10 includes the semiconductor region 13 and the silicon region 11 adjacent to the semiconductor region 13. In other exemplary embodiments, an isolation structure may be formed between the semiconductor region 13 and the silicon region 11 optionally. As depicted in FIG. 2D and operation 220 in FIG. 3, a planarization operation with the second slurry 42 is performed to remove portions of the semiconductor region 13 and portions of the silicon region 11, and the second slurry 42 is an alkaline CMP slurry including the pH-adjustor and the silicon inhibitor described above. In some embodiments, the method for CMP is similar to the second. CMP operation in the manufacturing method of the semiconductor structure described above and will not be redundantly described.

Figure 4A:
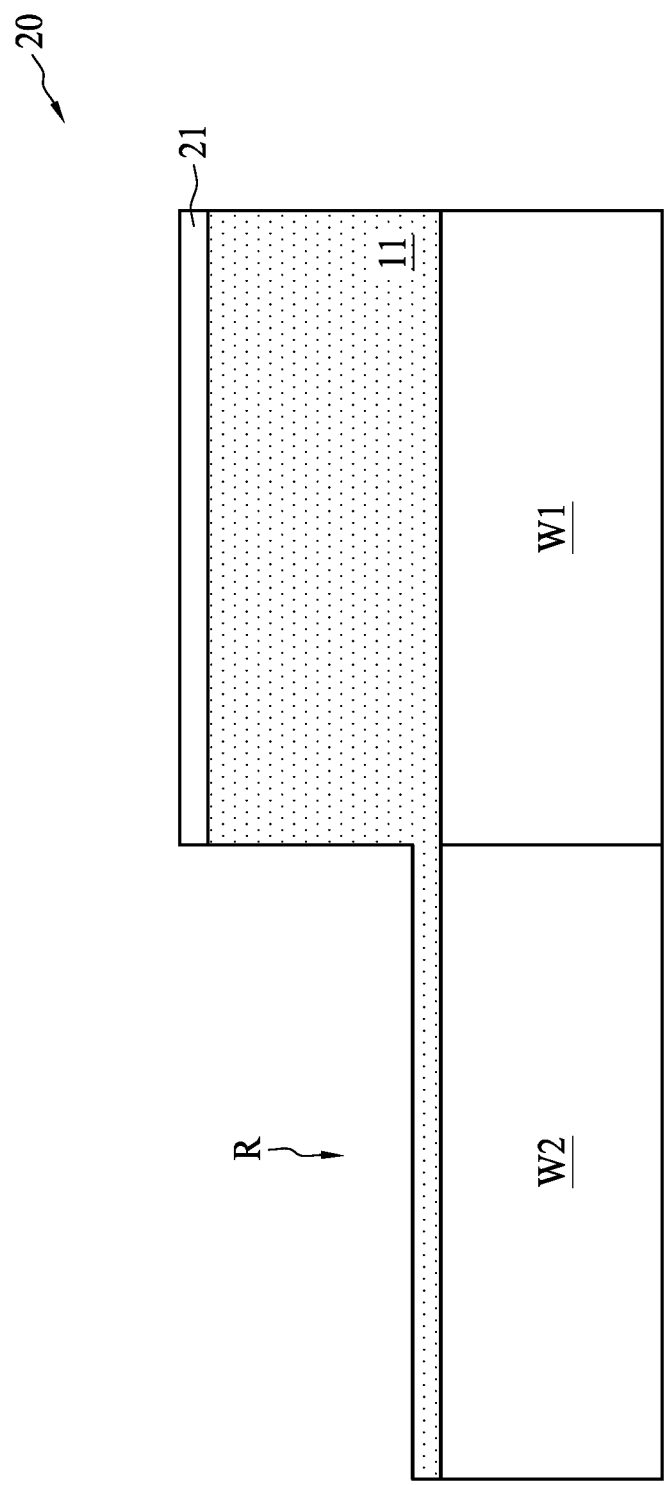
FIGS. 4A, 4B, 4G, 4D, and 4E are cross-sectional views at one of various operations of a manufacturing method of a semiconductor structure in accordance with some embodiments of the present disclosure.
Figure 4B:
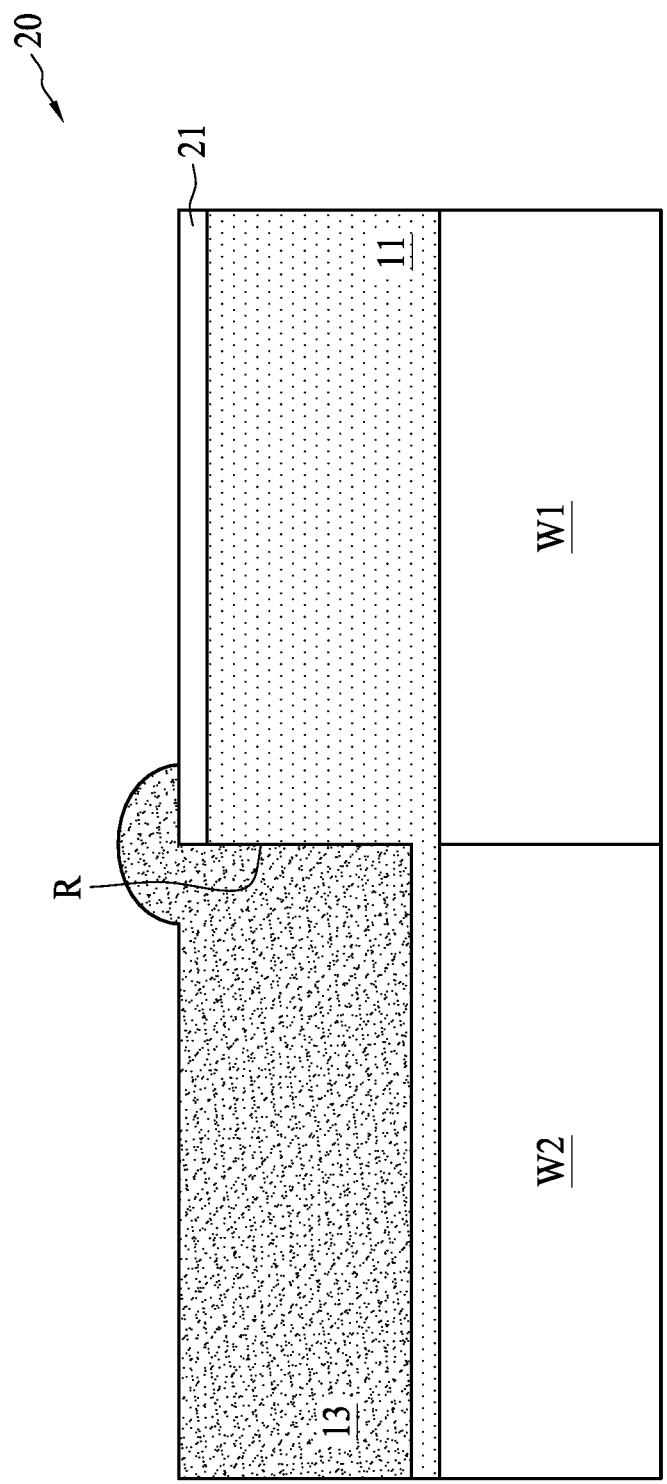
Figure 4C:
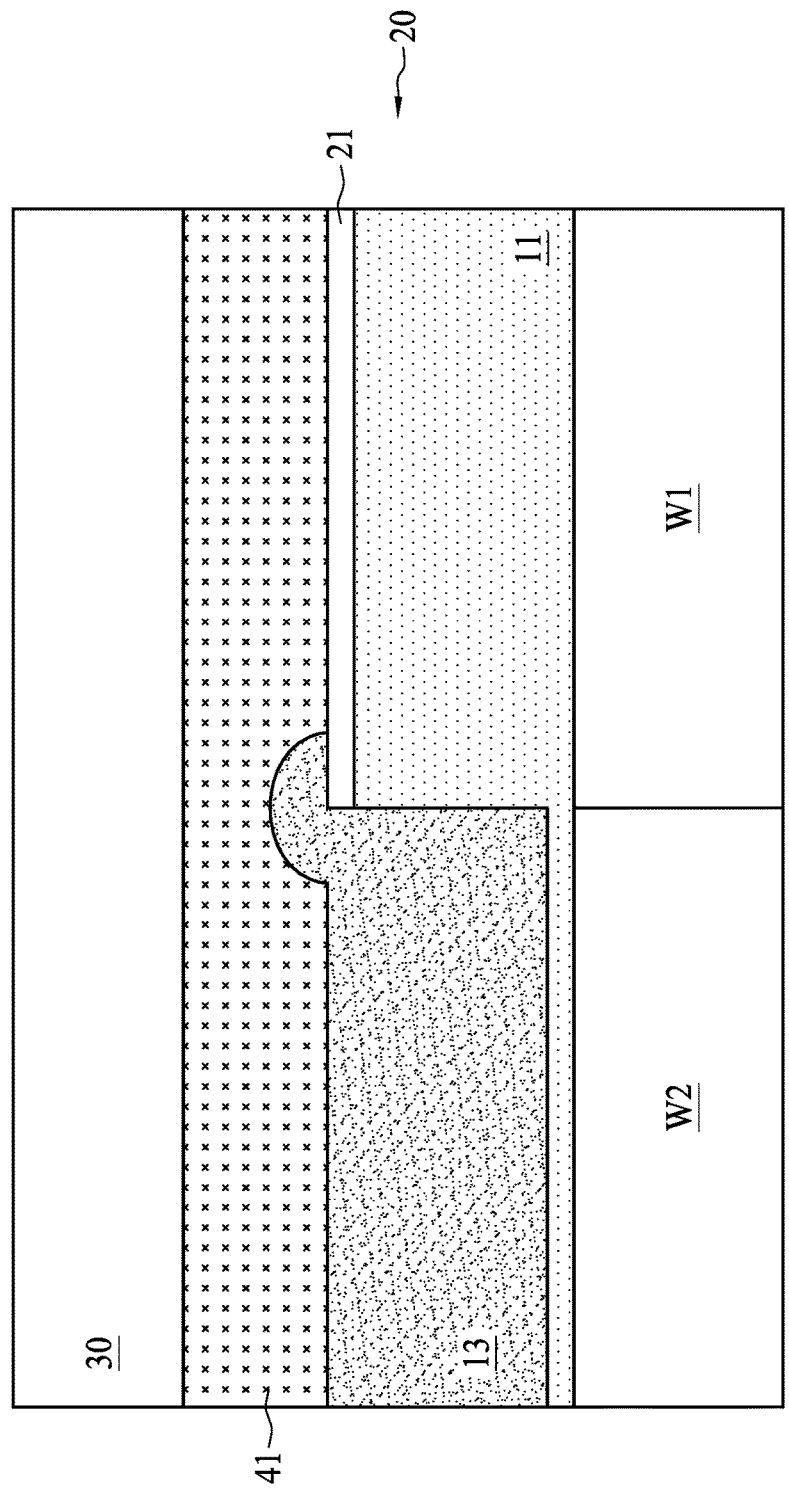
Figure 4D:
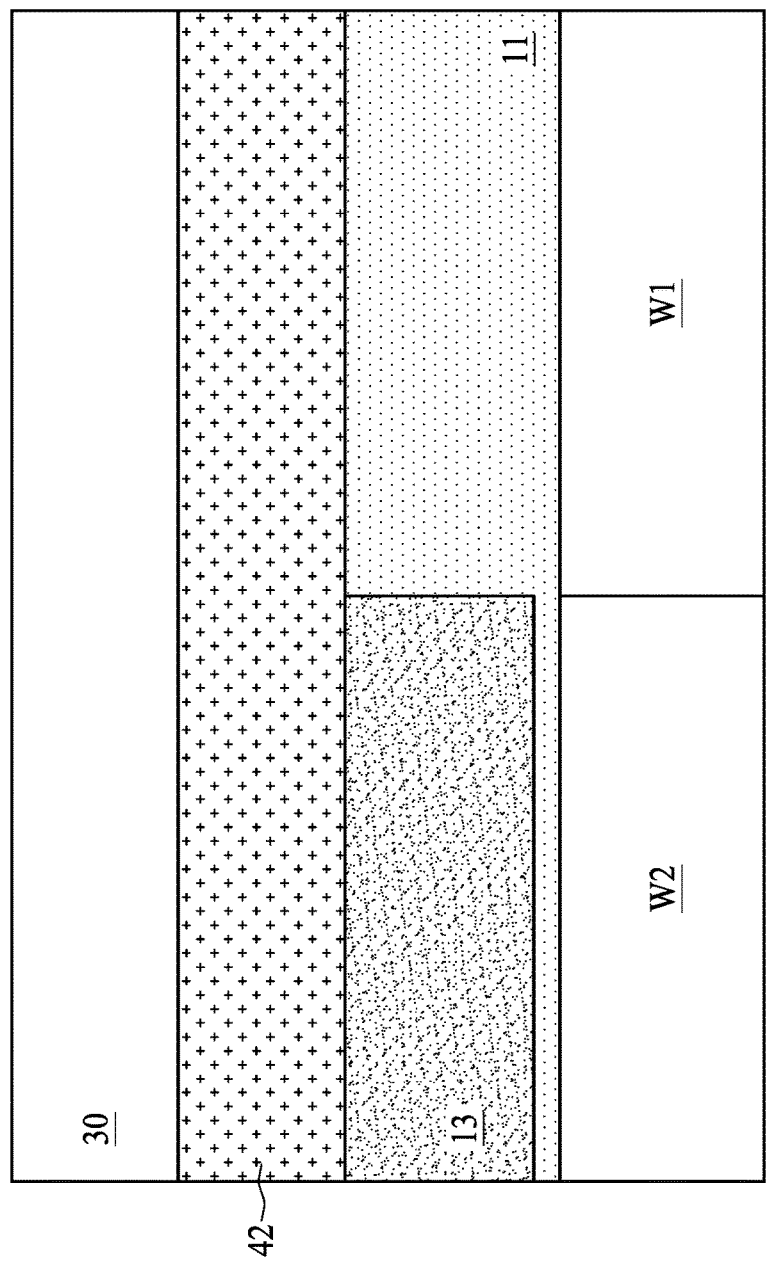

FIGS. 4A, 4B, 4C, 4D, and 4E are cross-sectional views at one of various operations of a manufacturing method of a semiconductor structure in accordance with some embodiments of the present disclosure. FIG. 4C is a schematic diagram illustrating the first CMP operation in the manufacturing method, and FIG. 4D is a schematic diagram illustrating the second CMP operation in the manufacturing method. As depicted in FIG. 4A, a semiconductor substrate 20 including the silicon region 11 and the recess R adjacent to the silicon region 11 is received. One difference between the semiconductor substrate 20 and the semiconductor substrate described in the above embodiments is that the recess R does not penetrate the silicon region 11 in the semiconductor substrate 20, and a part of the silicon region 11 is formed under the recess R. As depicted in FIG. 4B, the semiconductor region 13 is formed in the recess R by an epitaxial growth process or other suitable operations. In other words, in some embodiments, the semiconductor region 13 is formed on a part of the silicon region 11 exposed by the recess R.

As depicted in FIG. 4C, the first CMP operation with the first slurry 41 is performed to remove the first mask layer 21 and portions of the semiconductor region 13 in the semiconductor substrate 20. As depicted in FIG. 4D, the second CMP operation with the second slurry 42 is performed to the semiconductor region 13 and the silicon region 11. In some embodiments, the second slurry 42 is an alkaline CMP slurry which is different from the first slurry in the first CMP operation described in FIG. 4C, but not limited thereto. The second slurry 42 includes the pH-adjustor and the silicon inhibitor. The pH-adjustor is configured to provide an alkaline environment in the second slurry 42 for lowering the particle defects, and the silicon inhibitor in the second slurry 42 is configured to lower the removal rate of the silicon region 11 in the second CMP operation with the second slurry 42. The removal rate selectivity between the semiconductor region 13 and the silicon region 11 in the second CMP operation may be modified by adjusting the amount and/or the content of the silicon inhibitor in the second slurry 42.

Figure 4E:
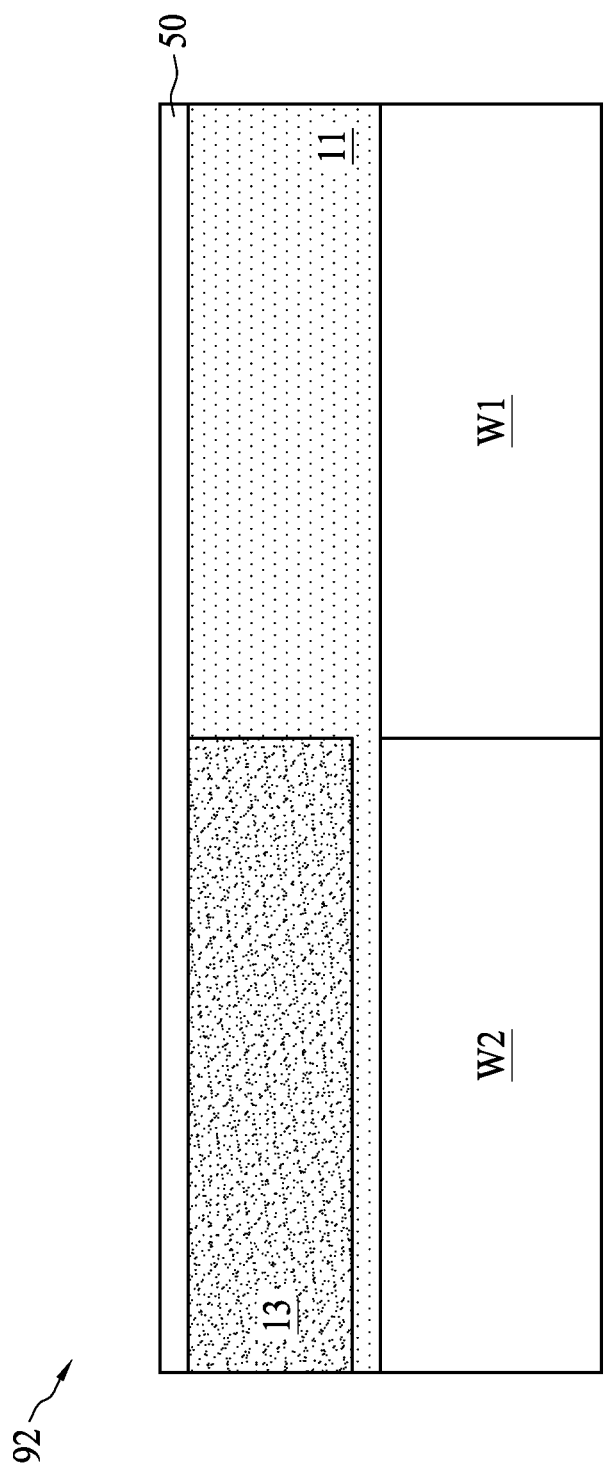

As depicted in FIG. 4E, after the second CMP operation and the post cleaning operation, the cap layer 50 may be formed on the semiconductor region 13 and the silicon region 11 for forming a semiconductor structure 92. In some embodiments, the semiconductor region 13 and the silicon region 11 in the semiconductor structure 92 may be channel regions for different conductive type MOSFETs, but the present disclosure is not limited to this. The silicon region 11 and the semiconductor region 13 configured to be other parts of a semiconductor device, such as the channel region and the source/drain region of the same MOSFET are within the contemplated scope of the present disclosure.

In the present disclosure, the chemical mechanical polishing (CMP) slurry includes the pH-adjustor and the silicon inhibitor. The pH-adjustor provides an alkaline environment in the CMP slurry, and the particle defect condition may be improved accordingly. The silicon inhibitor reduces the removal rate of the silicon region in the planarization operation, and the removal rate selectivity between the semiconductor region and the silicon region may be modified by adjusting the amount and/or the content of the silicon inhibitor in the alkaline CMP slurry.

In one exemplary aspect, a chemical mechanical polishing (CMP) slurry is provided in the present disclosure. The CMP slurry includes a pH-adjustor and a silicon inhibitor. The pH-adjustor is used to provide an alkaline environment in the CMP slurry, and the silicon inhibitor is used to lower a removal rate of a silicon region.

In another exemplary aspect, a method for chemical mechanical polishing (CMP) is provided. The method includes the following operations. A semiconductor substrate is received, and the semiconductor substrate includes a semiconductor region and a silicon region adjacent to the semiconductor region. The semiconductor region comprises at least one semiconductor material different from silicon. A planarization operation with an alkaline CMP slurry is performed to remove portions of the semiconductor region and portions of the silicon region.

In yet another aspect, a manufacturing method of a semiconductor structure is provided. The manufacturing method includes the following operations. A semiconductor substrate is received, and the semiconductor substrate includes an silicon region and a recess adjacent to the silicon region. A semiconductor region is formed in the recess, and the semiconductor region comprises at least one semiconductor material different from silicon. A chemical mechanical polishing (CMP) operation with an alkaline CMP slurry is performed to the semiconductor region and the silicon region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for chemical mechanical polishing (CMP), comprising:
    receiving a substrate, wherein the substrate comprises a first well region of a first conductivity type, a second well region of a second conductivity type different from the first conductivity type and adjacent to the first well region, a silicon region over the first well region, a mask layer on the silicon region, and a semiconductor region adjacent to the silicon region, the semiconductor region comprising at least one semiconductor material different from silico;
    performing a first planarization operation with a first slurry to remove the mask layer and a first portion of the semiconductor region; and
    performing a second planarization operation with a second slurry different from the first slurry to remove a second portion of the semiconductor region and a portion of the silicon region.

2. The method of claim 1, wherein the first slurry comprises:
    a pH-adjustor; and
    a silicon inhibitor.

3. The method of claim 2, wherein the silicon inhibitor comprises an inhibitor lowering a removal rate of the silicon region in the planarization operation.

4. The method of claim 1, wherein the first slurry has a selectivity, with the selectivity being a ratio of a first removal rate of the semiconductor region to a second removal rate of the silicon region, and the selectivity is higher than 0.6.

5. The method of claim 2, wherein the silicon inhibitor comprises alkyl carboxylic acid, poly ethylene glycol, or polyoxyethylene alkyl ether.

6. The method of claim 2, wherein a concentration of the silicon inhibitor in the first slurry is lower than or equal to 0.1% by weight.

7. The method of claim 2, wherein the first slurry has a pH value greater than 7 and less than 12.

8. The method of claim 1, wherein the mask layer comprises a dielectric material.

9. A method of manufacturing a semiconductor structure, the method comprising:
    receiving a substrate, wherein the substrate comprises:
        a first well region of a first conductivity type;
        a second well region of a second conductivity type different from the first conductivity type and adjacent to the first well region;
        a silicon region over the first well region and covering the second well region; and
        a recess adjacent to the silicon region and over the second well region, the silicon region defining a bottom surface of the recess;
    completely filling the recess with a semiconductor material different from silicon to form a semiconductor region in the recess; and
    performing a chemical mechanical polishing (CMP) operation with an alkaline CMP slurry to the semiconductor region and the silicon region.

10. The manufacturing method of claim 9, wherein the alkaline CMP slurry comprises:
    a pH-adjustor; and
    a silicon inhibitor configured to lower a removal rate of the silicon region in the CMP operation.

11. The manufacturing method of claim 9, wherein the semiconductor region comprises a silicon germanium region.

12. A method of manufacturing a semiconductor structure, the method comprising:
  receiving a substrate, wherein the substrate comprises;
    a silicon region;
    a first well region of a first conductivity type under the silicon region;
    a second well region of a second conductivity type different from the first conductivity type adjacent to the first well region, the silicon region covering the second well region; and
    a recess in the silicon region and aligned with the second well region,
    wherein the substrate further comprises a mask layer covering an entirety of the silicon region;
  completely filling the recess with a semiconductor material different from silicon to form a semiconductor region in the recess; and
  removing an entirety of the mask layer, a portion of the semiconductor region and a portion of the silicon region with an alkaline chemical mechanical polishing (CMP) slurry comprising a silicon inhibitor.

13. The method of claim 12, wherein the silicon inhibitor comprises alkyl carboxylic acid, poly ethylene glycol, or polyoxyethylene alkyl ether.

14. The method of claim 13, wherein the polyoxyethylene alkyl ether comprises polyoxyethylene lauryl ether or polyoxyethylene tridecyl ether.

15. The method of claim 12, wherein the alkaline CMP slurry has a selectivity, with the selectivity being a ratio of a first removal rate of the semiconductor region to a second removal rate of the silicon region, and the selectivity is between 1 and 4.

16. The method of claim 12, wherein a concentration of the silicon inhibitor in the alkaline CMP slurry is lower than or equal to 0.1% by weight.

17. The method of claim 12, wherein the alkaline CMP slurry has a pH value between 8 and 10.

18. The method of claim 12, wherein the alkaline CMP slurry further comprises a pH adjustor comprising at least one of ammonium hydroxide ($NH_4OH$) and quaternary ammonium hydroxide salt.

19. The method of claim 12, further comprising forming a cap layer over the semiconductor region and the silicon region subsequent to the polishing operation.

20. The method of claim 12, prior to the polishing operation with the alkaline CMP slurry, further comprising performing a CMP operation on the semiconductor region and the silicon region with an acidic slurry.

* * * * *